United States Patent
Yuan et al.

(10) Patent No.: US 8,067,269 B2
(45) Date of Patent: Nov. 29, 2011

(54) METHOD FOR FABRICATING AT LEAST ONE TRANSISTOR

(75) Inventors: Shu Yuan, Singapore (SG); Xuejun Kang, Singapore (SG); Shi Ming Lin, Singapore (SG)

(73) Assignee: Tinggi Technologies Private Limted, Singapore (SG)

( * ) Notice: Subject to any disclaimer, the term of this patent is extended or adjusted under 35 U.S.C. 154(b) by 610 days.

(21) Appl. No.: 12/091,036

(22) PCT Filed: Sep. 1, 2006

(86) PCT No.: PCT/SG2006/000255
§ 371 (c)(1),
(2), (4) Date: Apr. 21, 2008

(87) PCT Pub. No.: WO2007/046773
PCT Pub. Date: Apr. 26, 2007

(65) Prior Publication Data
US 2008/0224173 A1    Sep. 18, 2008

(30) Foreign Application Priority Data

Oct. 19, 2005  (SG) ............................... 200506897-8

(51) Int. Cl.
*H01L 21/50* (2006.01)
(52) U.S. Cl. .................. 438/122; 438/121; 438/E21.403
(58) Field of Classification Search .......... 438/122–125, 438/705–720; 257/192–195, 712–706, 77–79, 257/98–103
See application file for complete search history.

(56) References Cited

U.S. PATENT DOCUMENTS

| | | | |
|---|---|---|---|
| 3,897,627 | A | 8/1975 | Klatskin |
| 4,107,720 | A | 8/1978 | Pucel et al. |
| 5,192,987 | A | 3/1993 | Khan et al. |
| 5,405,804 | A | 4/1995 | Yabe |
| 5,654,228 | A | 8/1997 | Shieh et al. |
| 5,719,433 | A | 2/1998 | Delage et al. |
| 5,811,927 | A | 9/1998 | Anderson et al. |

(Continued)

FOREIGN PATENT DOCUMENTS

CN    1373522 A    10/2002

(Continued)

OTHER PUBLICATIONS

M.K. Kelly, et al., "Optical Process for Liftoff of Group III-Nitride Films," Physica Status Solidi (a), vol. 159, Issue 1, pp. R3-R4, (Nov. 28, 1996).

(Continued)

*Primary Examiner* — Dung A Le
(74) *Attorney, Agent, or Firm* — Blakely, Sokoloff, Taylor & Zafman LLP.

(57) ABSTRACT

A method for fabricating transistors such as high electron mobility transistors, each transistor comprising a plurality of epitaxial layers on a common substrate, method comprising: (a) forming a plurality of source contacts on a first surface of the plurality of epitaxial layers; (b) forming at least one drain contact on the first surface; (c) forming at least one gate contact on the first surface; (d) forming at least one insulating layer over and between the gate contacts, source contacts and the drain contacts; (e) forming a conductive layer over at least a part of the at least one insulating layer for connecting the source contacts; and (f) forming at least one heat sink layer over the conductive layer.

9 Claims, 10 Drawing Sheets

U.S. PATENT DOCUMENTS

| | | | |
|---|---|---|---|
| 5,879,862 A | 3/1999 | Roh | |
| 6,020,261 A | 2/2000 | Weisman | |
| 6,091,085 A | 7/2000 | Lester | |
| 6,169,297 B1 | 1/2001 | Jang et al. | |
| 6,210,479 B1 | 4/2001 | Bojarczuk et al. | |
| 6,259,156 B1 | 7/2001 | Kohno | |
| 6,303,405 B1 | 10/2001 | Yoshida et al. | |
| 6,307,218 B1 | 10/2001 | Steigerwald et al. | |
| 6,319,778 B1 | 11/2001 | Chen et al. | |
| 6,365,429 B1 | 4/2002 | Kneissl et al. | |
| 6,380,564 B1 | 4/2002 | Chen et al. | |
| 6,420,242 B1 | 7/2002 | Cheung et al. | |
| 6,420,732 B1 | 7/2002 | Kung et al. | |
| 6,426,512 B1 | 7/2002 | Ito et al. | |
| 6,448,102 B1 | 9/2002 | Kneissl et al. | |
| 6,455,870 B1 | 9/2002 | Wang et al. | |
| 6,492,661 B1 | 12/2002 | Chien et al. | |
| 6,509,270 B1 | 1/2003 | Held | |
| 6,562,648 B1 | 5/2003 | Wong et al. | |
| 6,573,537 B1 | 6/2003 | Steigerwald et al. | |
| 6,586,875 B1 | 7/2003 | Chen et al. | |
| 6,589,857 B2 | 7/2003 | Ogawa et al. | |
| 6,627,921 B2 | 9/2003 | Wong et al. | |
| 6,627,989 B2 * | 9/2003 | Kohno et al. | 257/706 |
| 6,649,437 B1 | 11/2003 | Yang et al. | |
| 6,677,173 B2 | 1/2004 | Ota | |
| 6,821,804 B2 | 11/2004 | Thibeault et al. | |
| 7,338,822 B2 | 3/2008 | Wu et al. | |
| 7,348,212 B2 | 3/2008 | Schiaffino et al. | |
| 7,763,477 B2 | 7/2010 | Yuan et al. | |
| 8,004,001 B2 | 8/2011 | Yuan et al. | |
| 2001/0055324 A1 | 12/2001 | Ota | |
| 2002/0022286 A1 | 2/2002 | Nikolaev et al. | |
| 2002/0034835 A1 | 3/2002 | Chen et al. | |
| 2002/0093023 A1 | 7/2002 | Camras et al. | |
| 2002/0113279 A1 | 8/2002 | Hanamaki et al. | |
| 2002/0117681 A1 | 8/2002 | Weeks et al. | |
| 2002/0134985 A1 | 9/2002 | Chen et al. | |
| 2002/0137243 A1 | 9/2002 | Chen et al. | |
| 2002/0179910 A1 | 12/2002 | Slater, Jr. | |
| 2003/0038284 A1 | 2/2003 | Kurahashi et al. | |
| 2003/0064535 A1 | 4/2003 | Kub et al. | |
| 2003/0111667 A1 | 6/2003 | Schubert | |
| 2003/0151357 A1 | 8/2003 | Uemura | |
| 2003/0178626 A1 | 9/2003 | Sugiyama et al. | |
| 2003/0189212 A1 | 10/2003 | Yoo | |
| 2003/0189215 A1 | 10/2003 | Lee et al. | |
| 2003/0218179 A1 | 11/2003 | Koide et al. | |
| 2004/0026709 A1 | 2/2004 | Bader et al. | |
| 2004/0031967 A1 | 2/2004 | Fudeta et al. | |
| 2004/0033638 A1 | 2/2004 | Bader et al. | |
| 2004/0065889 A1 | 4/2004 | Ueda et al. | |
| 2004/0104395 A1 | 6/2004 | Hagimoto et al. | |
| 2004/0110395 A1 | 6/2004 | Ueda et al. | |
| 2004/0130037 A1 | 7/2004 | Mishra et al. | |
| 2004/0144991 A1 | 7/2004 | Kikkawa | |
| 2004/0217362 A1 | 11/2004 | Slater, Jr. et al. | |
| 2004/0235210 A1 | 11/2004 | Tamura et al. | |
| 2005/0014303 A1 | 1/2005 | Tsai et al. | |
| 2005/0026399 A1 | 2/2005 | Chien et al. | |
| 2005/0035354 A1 | 2/2005 | Lin et al. | |
| 2005/0082555 A1 | 4/2005 | Chien et al. | |
| 2005/0087884 A1 | 4/2005 | Stokes et al. | |
| 2005/0093002 A1 | 5/2005 | Tsai et al. | |
| 2005/0098792 A1 | 5/2005 | Lee et al. | |
| 2005/0127397 A1 | 6/2005 | Borges et al. | |
| 2005/0142875 A1 | 6/2005 | Yoo | |
| 2005/0164482 A1 | 7/2005 | Saxler | |
| 2005/0173692 A1 | 8/2005 | Park et al. | |
| 2006/0006554 A1 | 1/2006 | Yoo et al. | |
| 2006/0099730 A1 | 5/2006 | Lee et al. | |
| 2006/0124939 A1 | 6/2006 | Lee et al. | |
| 2006/0151801 A1 | 7/2006 | Doan et al. | |
| 2006/0154390 A1 | 7/2006 | Tran et al. | |
| 2006/0154391 A1 | 7/2006 | Tran et al. | |
| 2006/0154392 A1 | 7/2006 | Tran et al. | |
| 2006/0154393 A1 | 7/2006 | Doan et al. | |
| 2006/0157721 A1 | 7/2006 | Tran et al. | |
| 2006/0163586 A1 | 7/2006 | Denbaars et al. | |
| 2006/0186418 A1 | 8/2006 | Edmond et al. | |
| 2007/0029541 A1 | 2/2007 | Xin et al. | |
| 2008/0164480 A1 | 7/2008 | Kang et al. | |
| 2008/0210970 A1 | 9/2008 | Kang et al. | |
| 2008/0265366 A1 * | 10/2008 | Guo et al. | 257/529 |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| EP | 1 502 284 A2 | 2/2005 |
| EP | 1693891 A2 | 8/2006 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 7326628 A | 12/1995 |
| JP | 10-117016 | 5/1998 |
| JP | 2000-164928 | 6/2000 |
| JP | 2000-183400 | 6/2000 |
| JP | 2000-277804 | 10/2000 |
| JP | 2000-294837 | 10/2000 |
| JP | 2001-035974 A | 2/2001 |
| JP | 2001-036129 | 2/2001 |
| JP | 2001-049491 | 2/2001 |
| JP | 2001-168094 A | 6/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-152138 A | 5/2003 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2004-319552 A | 11/2004 |
| JP | 2005-012188 | 1/2005 |
| JP | 2005-236048 | 9/2005 |
| JP | 2005-260255 A | 9/2005 |
| JP | 2005-286187 A | 10/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506301-1 | 9/2005 |
| SG | 200508210-2 | 12/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 B | 7/2003 |
| WO | WO 01/47039 A1 | 6/2001 |
| WO | WO 03/088320 A2 | 10/2003 |
| WO | WO 2004/102686 A1 | 11/2004 |
| WO | WO 2005/029572 A1 | 3/2005 |
| WO | WO 2005/029573 A1 | 3/2005 |
| WO | WO 2005/062745 A2 | 7/2005 |
| WO | WO 2005/064666 A1 | 7/2005 |
| WO | WO 2005/088743 A1 | 9/2005 |
| WO | WO 2005/096365 A1 | 10/2005 |
| WO | WO 2005/098974 A1 | 10/2005 |
| WO | WO 2005/104780 A2 | 11/2005 |
| WO | WO 2007/037762 A1 | 5/2007 |
| WO | WO 2007/073354 A1 | 6/2007 |
| WO | WO 2008/020819 A1 | 2/2008 |
| WO | WO 2008/030188 A1 | 3/2008 |

OTHER PUBLICATIONS

Zhifang Fan, et al., "Very Low Resistance Multilayer Ohmic Contact to n-GaN," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the p-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P$/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAlP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Application No. PCT/SG2005/000254 containing Communication relating to the Results of the Partial International Search Report, 4 pgs., (Nov. 16, 2006).

PCT International Search Report for PCT Counterpart Application No. PCT/SG2005/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

Tetsuzo Ueda, et al., "Vertical InGaN-Based Blue Light Emitting Diode with Plated Metal Base Fabricated using Laser Lift-Off Technique," Physica Status Solidi (c), vol. 0, Issue 7, pp. 2219-2222, (Oct. 20, 2003).

Chen-Fu Chu, et al., "Comparison of p-Side Down and p-Side Up GaN Light-Emitting Diodes Fabricated by Laser Lift-Off", Japan Journal of Applied Physics, vol. 42, Part 2, No. 2B, pp. L147-L150, (Feb. 15, 2003).

W.H. Li, et al., "Electrochemical Deposition of Copper on Patterned Cu/Ta(N)SiO2 Surfaces for Super Filling of Sub-Micron Features", Journal of Applied Electrochemistry, vol. 31, pp. 1395-1397, (Aug. 20, 2001).

PCT International Preliminary Report on Patentability for PCT Counterpart Application No. PCT/SG2006/000255, 10 pgs., (Aug. 29, 2007).

PCT Written Opinion of the International Searching Authority for PCT Counterpart Application No. PCT/SG2006/000255, 4 pgs., (Nov. 6, 2006).

Supplementary European Search Report for EP06784267, 3 pages (Jan. 27, 2011).

Supplementary European Search Report for European Application No. 05711220.3-2222, 3 pages, (Nov. 30, 2010).

Supplementary European Search Report for European Application No. 06784267.4-1235, 4 pgs., (Feb. 4, 2011).

* cited by examiner

METHOD FOR FABRICATING AT LEAST ONE TRANSISTOR

CROSS-REFERENCE TO OTHER APPLICATIONS

This is a National Phase of International Application No. PCT/SG2006/000255, filed on Sep. 1, 2006, which claims priority from Singaporean Patent Application No. 200506897-8, filed on Oct. 19, 2005.

FIELD OF THE INVENTION

This invention relates to the fabrication of transistors and refers particularly, though not exclusively, to the fabrication of gallium nitride high electron mobility transistors ("HEMT") and to transistors so fabricated.

BACKGROUND OF THE INVENTION

HEMT devices have been proposed for a few years. They are capable of high power with over 100 W/chip being possible; high frequency—1 to 40 GHz being possible; and can operate at temperatures of over 600° C. This generates a lot of heat so heat dissipation becomes important as not all devices can withstand such temperatures, and the HEMT device may be used with many other devices.

SUMMARY OF THE INVENTION

In accordance with a first preferred aspect there is provided a method for fabricating transistors, each transistor comprising a plurality of epitaxial layers on a substrate, method comprising:
   forming a plurality of source contacts on a first surface of the plurality of epitaxial layers;
      forming at least one drain contact on the first surface;
      forming at least one gate contact on the first surface;
      forming at least one insulating layer over and between the gate contact, source contacts and drain contact to insulate the gate contact, source contacts and the drain contact;
      forming a conductive layer-over and through at least a part of the at least one insulating layer for connecting the source contacts; and
      forming at least one heat sink layer over the conductive layer.
   According to a second preferred aspect there is provided an apparatus comprising transistors, each transistor comprising:
      a plurality of epitaxial layers having a first surface;
         a plurality source contacts, at least one drain contact, and at least one gate contact, all on the first surface;
         at least one insulating layer over and between the gate contact, source contacts and drain contact for insulating the gate contact, source contacts and the drain contact;
         a conductive layer over and through at least a part of the at least one insulating layer for connecting the source contacts; and
         at least one heat sink layer over the conductive layer.
The transistors may be high electron mobility transistors. The plurality of epitaxial layers may comprise a layer of gallium nitride, a layer of aluminium gallium nitride, a layer of n+ aluminium gallium nitride and a final layer of gallium nitride. The first surface may be on the final layer of gallium nitride. The conductive layer may connect the plurality of source contacts through vias in the at least one insulating layer. The at least one insulating layer may be heat conductive and electrically insulating.

A relatively thick layer of a heat conductive metal may be formed over the conductive layer. At least one seed layer may be formed on the conductive layer before the relatively thick layer is formed.

The drain, gate and source connections may be formed by creating then filling vias through the substrate and the epitaxial layers to the drain contact, gate contact and the conductive layer respectively.

Alternatively, the substrate may be removed and the drain, gate and source connections formed by creating then filling vias through the expitaxial layers to the drain contact, gate contact and conductive layer respectively. In this case, a further layer of heat conductive but electrically insulating material may be applied in place of the substrate.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
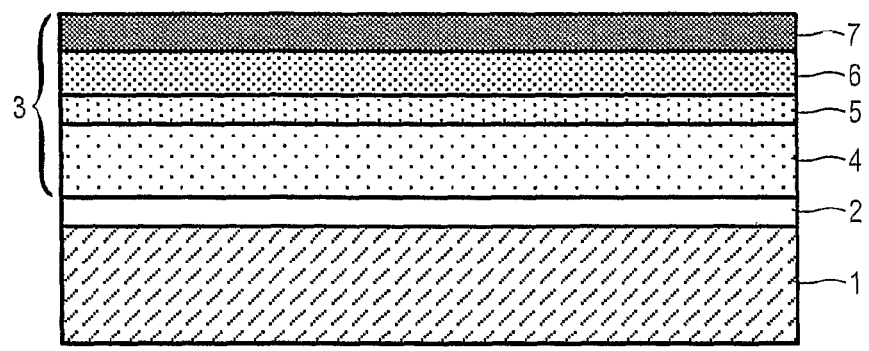
FIG. 1 is a schematic illustration of a device at a first stage of the fabrication process.

FIG. 1 shows the structure at the commencement of fabrication. A sapphire substrate 1 has a buffer layer 2 above it, and the epitaxial layers 3 are on the buffer layer 2. The epitaxial layers 3 comprise a layer 4 of GaN, a layer 5 of AlGaN, and n+ layer 6 of AlGaN, and a final GaN layer 7.

Figure 2:
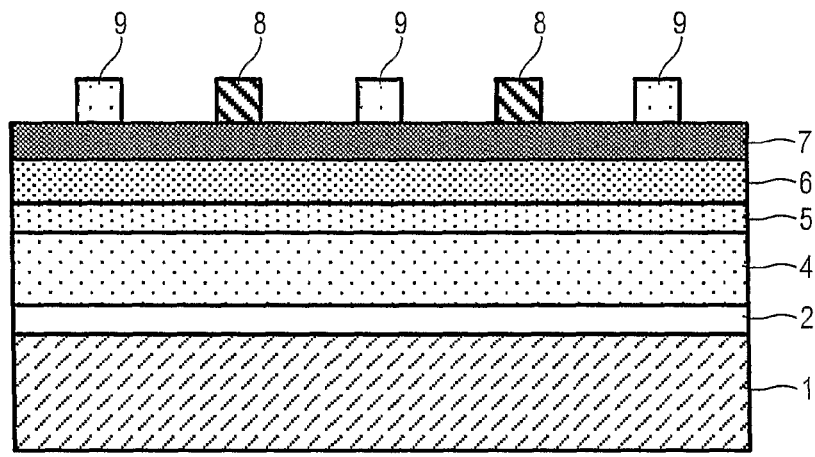
FIG. 2 is a schematic illustration of the device at a second stage of the fabrication process.
Figure 3:
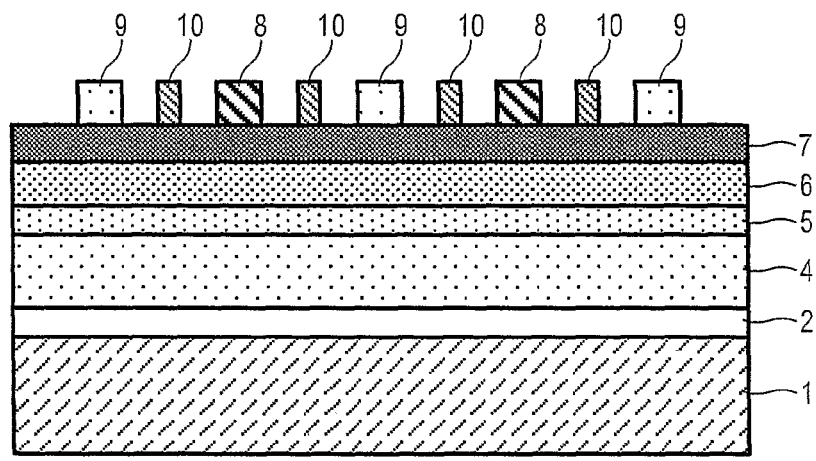
FIG. 3 is a schematic illustration of the device at a third stage of the fabrication process.

Source 8 and drain 9 contacts are then formed on the surface of the final GaN layer (FIG. 2) there being a source 8 and a drain contact 9 for each transistor. Gate contacts 10 are then formed between each source contact 8 and each drain contact 9 (FIG. 3). In this way when each gate 10 is activated current will flow from one source 8 to the two drains 9, one on each side of source contact 8.

Figure 4:
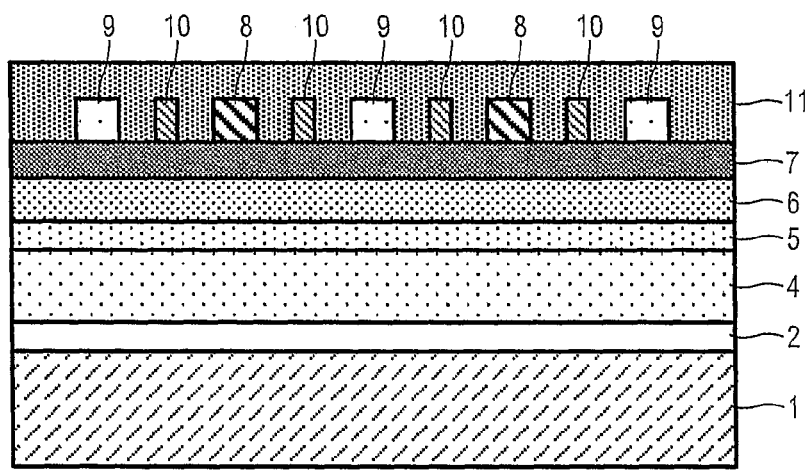
FIG. 4 is a schematic illustration of the device at a fourth stage of the fabrication process.
Figure 5:
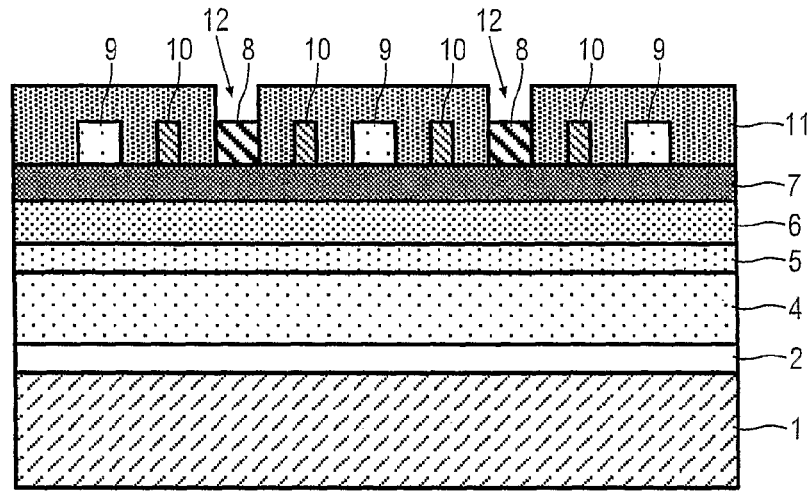
FIG. 5 is a schematic illustration of the device at a fifth stage of the fabrication process.
Figure 6:
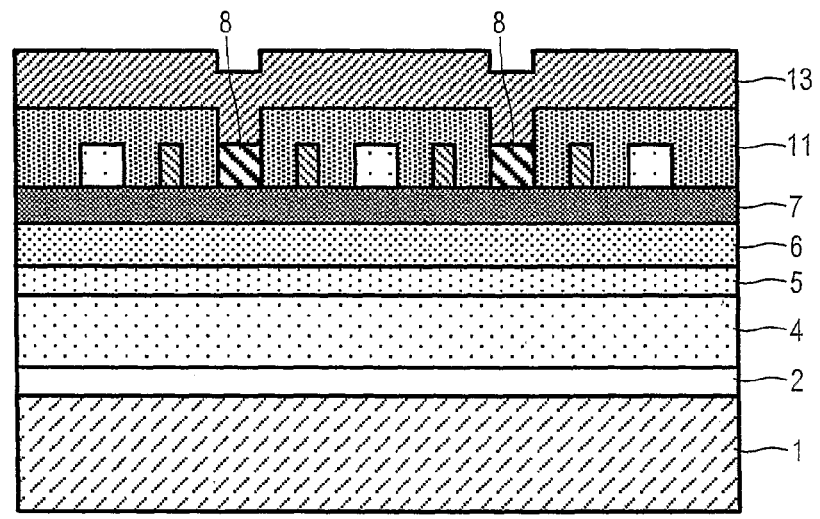
FIG. 6 is a schematic illustration of the device at a sixth stage of the fabrication process.

As shown in FIG. 4, an electrically insulating layer such as a passivation layer 11 of, for example AlN, is then applied to electrically insulate the contacts 8, 9, 10 while being able to conduct heat. The layer 11 is preferably heat conductive. A resist is applied over passivation layer 11 (FIG. 5) and vias 12 formed through passivation layer 11 down to the source contacts 8 and the resist removed. A further layer 13 of an electrically and heat conductive metal is applied over the passivation layer 13, the layer 16 also filling the vias 12. This connects the source contacts 8 (FIG. 6). In this way, all contacts 8, 9 and 10 are in the one plane.

Figure 7:
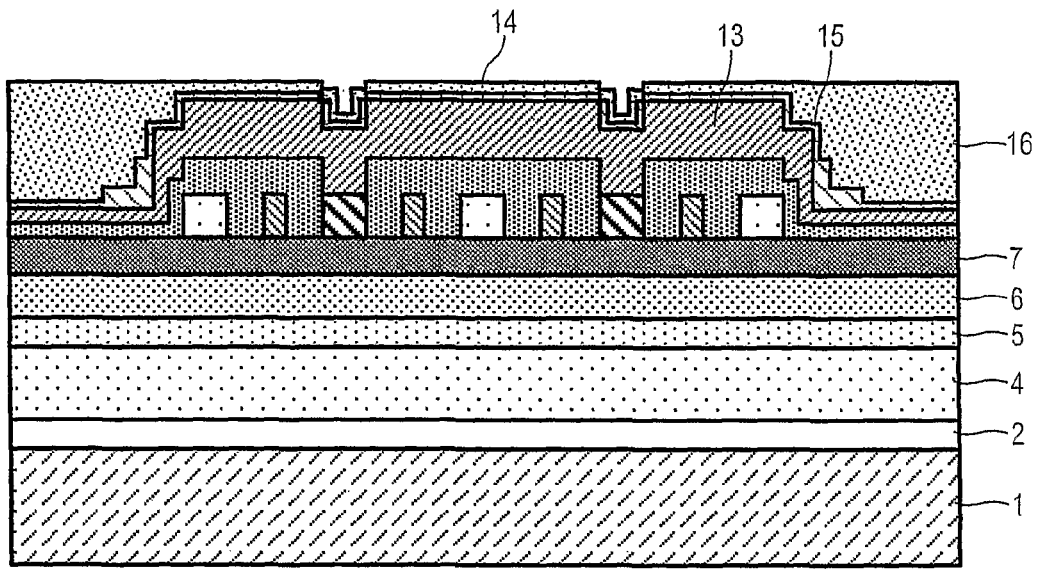
FIG. 7 is a schematic illustration of the device at a seventh stage of the fabrication process.

As shown in FIG. 7, at least one further layer 14 is applied over the conductive metal layer 13 and the passivation layer 11 not covered by the conductive metal layer 13. The further layer 14 is a seed layer.

The seed layer 14 may be a number of layers—for example, three different metal layers. The first seed layer should adhere well to the conductive layer 13 and may be of chromium or titanium. It may be followed by second layer and third layer that may be of tantalum and copper respectively. Other materials may be used for all seed layers. The second seed layer may act as a diffusion barrier, preventing copper or other materials placed on top of it (such as, for example, the third seed layer) from diffusing, into the expitaxial layers 3. The third seed layer acts as a seeding layer for subsequent electroplating.

As shown, there are two layers 15, 16 with the layer 15 acting as the diffusion barrier and the other layer 16 being the seeding layer.

The coefficients of thermal expansion of the seed layers may be different from that of GaN which is 3.17. While the thermal expansion coefficients of the contact layers 13 may be different from that of GaN (they are 14.2 and 13.4 respectively), they are relatively thin (a few nanometers) and do not pose serious stress problems to the underlining GaN epitaxial layers. However, plated copper to be added later may be as thick as hundreds of microns and thus may cause severe stress problems. Thus, the seed layers can be used to buffer the stress. This may be by one or more of:

by having sufficient flexibility to absorb the stress,
by having sufficient internal slip characteristics to absorb the stress,
by having sufficient rigidity to withstand the stress, and
by having graded thermal expansion coefficients.

In the case of graded thermal coefficients, that of the first layer preferably less than that of the second layer and that of the second layer is preferably less than that of the third layer and so forth. For example, as shown the first layer 15 may be tantalum with a coefficient of thermal expansion of 6.3, and the second layer 6 may be copper with a coefficient of thermal expansion of 16.5. In this way the coefficients of thermal expansion are graded from the passivation layer 13 and to the outer, copper layer 18. An alternative is to have coefficients of expansion that differ such that at the temperatures concerned, one metal layer expands while another contracts.

If the outer, copper layer 18 was applied directly to the contact layer 13 and passivation layer 11, the differences in their thermal expansion rates may cause cracking, separation, and/or failure. By depositing a plurality of seed layers of different materials, particularly metals each having a different coefficient of thermal expansion, the stresses of thermal expansion are spread through the seed layers with the resultant lower likelihood of cracking, separation and/or failure. If there are intermediate layer(s), the intermediate layer(s) should have coefficient(s) of expansion between those of layers 15 and 16, and should be graded from that of the first layer 15 to that of the final layer 16. There may be no intermediate layer, or there may be any required or desired number of intermediate layers (one, two, three and so forth).

Figure 8:
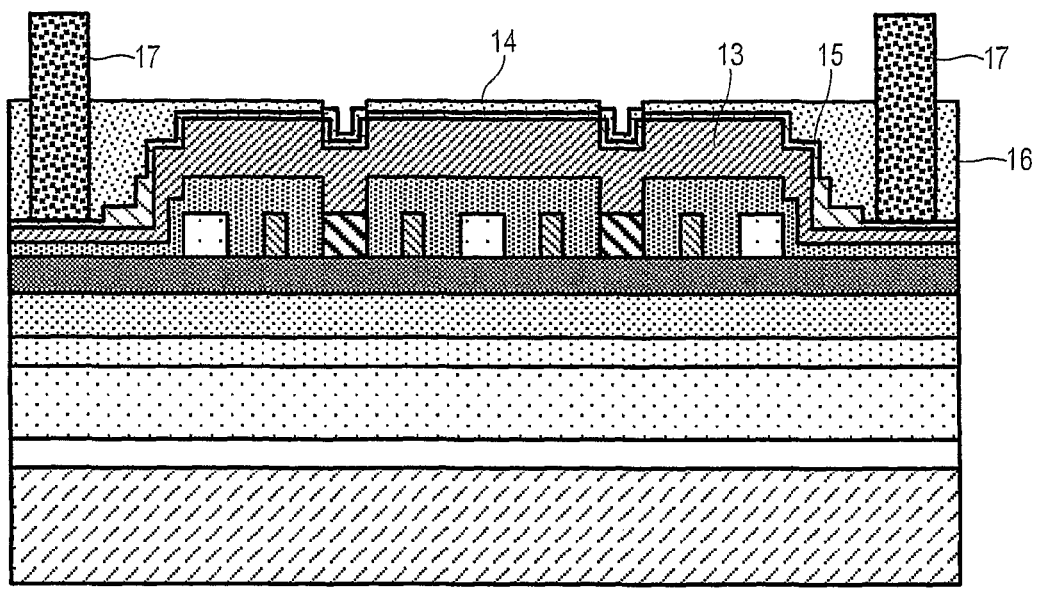
FIG. 8 is a schematic illustration of the device at an eighth stage of the fabrication process.
Figure 9:
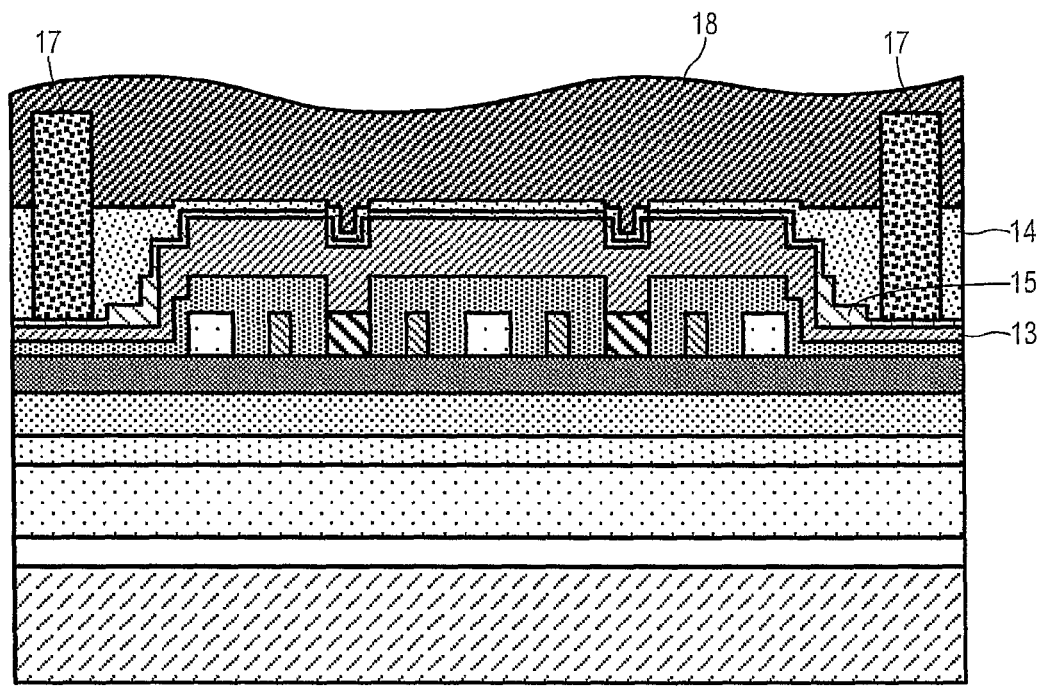
FIG. 9 is a schematic illustration of the device at a ninth stage of the fabrication process.

For patterned plating of a layer 18 of relatively thick metal such as copper that will serve as the new substrate and/or heat sink, a pattern of thick resists 17 is applied to the seed layer 15 by standard photolithography (FIG. 8), and the remaining metal 18 is plated between and over the thick resists 17 (FIG. 9) to form a single metal support layer 18.

Figure 10:
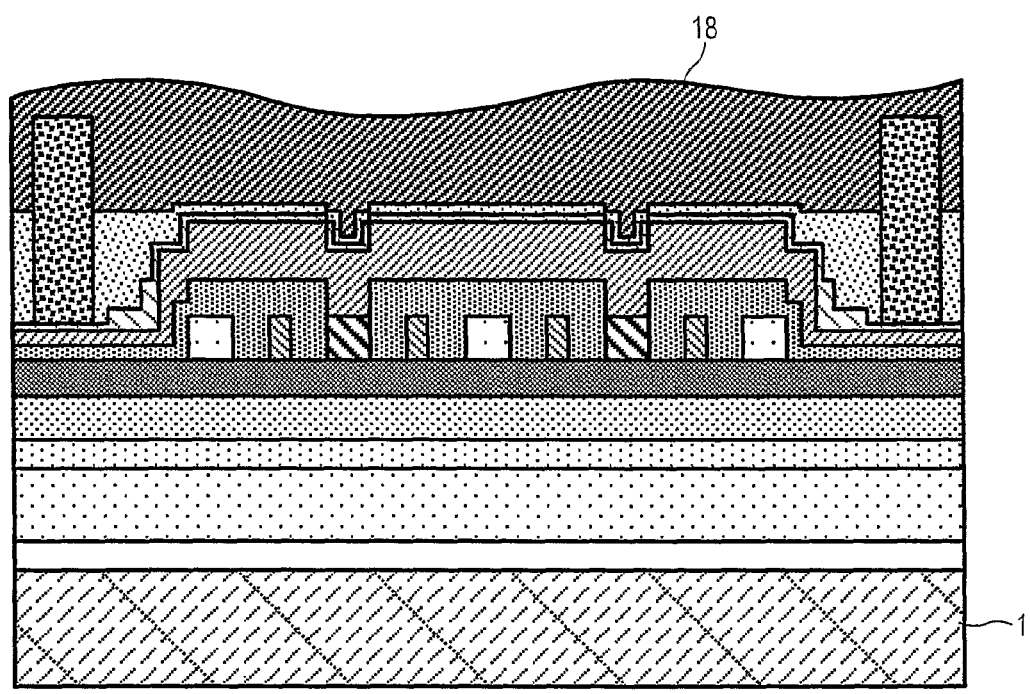
FIG. 10 is a schematic illustration of the device at a tenth stage of the fabrication process.
Figure 11:
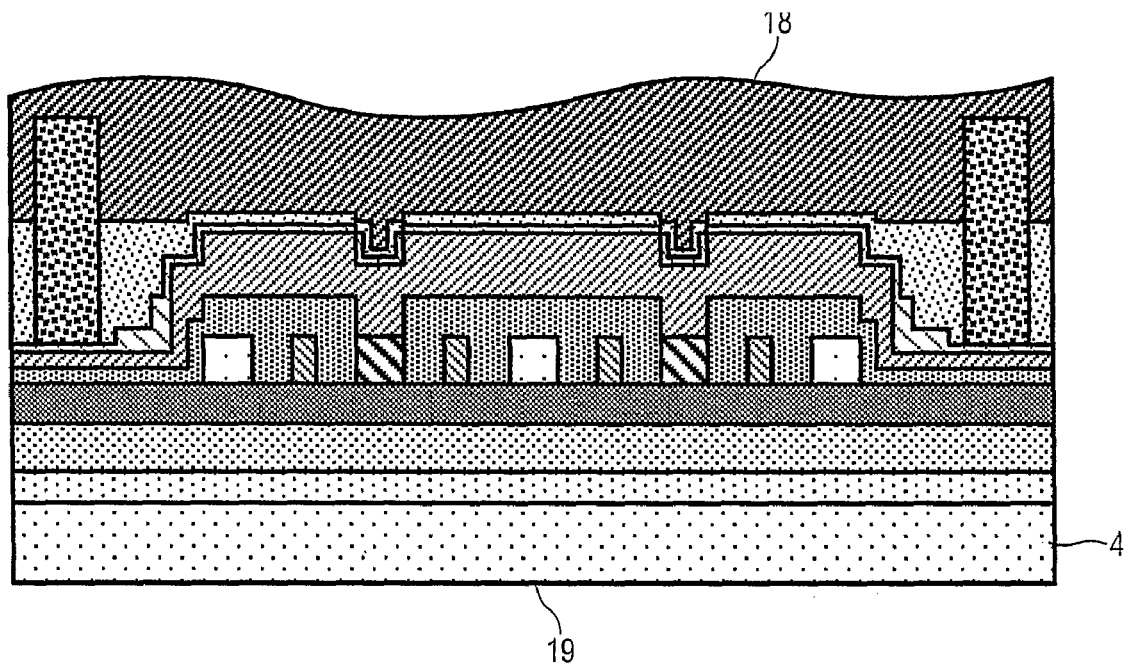
FIG. 11 is a schematic illustration of the device at an eleventh stage of the fabrication process.

The removal or lift-off of the sapphire substrate 1 then takes place (FIGS. 10 and 11) in accordance with known techniques such as, for example, that described in Kelly [M. K. Kelly, O. Ambacher, R. Dimitrov, R. Handschuh, and M. Stutzmann, phys. stat. sol. (a) 159, R3 (1997)]. The substrate 1 may also be removed by polishing or wet etching. This exposes the lowermost surface 19 of the GaN layer 4. It is preferred for lift-off of the substrate to take place while the epitaxial layers 3 are intact to improve the quality of removal, and for structural strength. By having the epitaxial layers 3 intact at the time of removal the electrical and mechanical properties of the epitaxial layers 3 are preserved.

After the removal of the original substrate 1, the thickly plated metal 18 is able to act as one or more of: the new mechanical support; and during operation of the semiconductor device is able to act as one or more of: a heat sink, a heat dissipater, and a connecting layer. As the final GaN layer 7 is relatively thin, the heat generated in active layers 3 is more easily able to be conducted to the thick layer 18. Also, each of the layers 11, 13 and 14 are heat conductive.

The seed layer(s) 14 may be an electrical insulating layer but must be a good thermal conductor e.g. AlN.

The thick layer 18 creates a parasitic capacitance that slows the speed of operation. By increasing the distance between layer 18 and the epitaxial layers 3, the parasitic capacitance is decreased.

Figure 12:
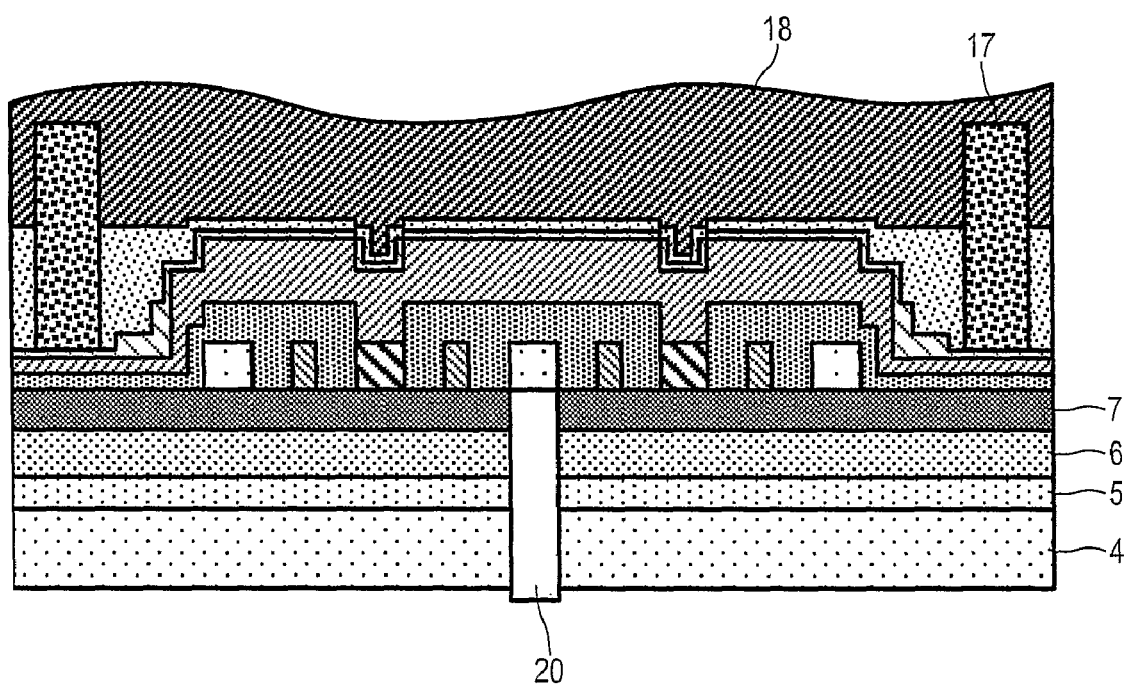
FIG. 12 is a schematic illustration of the device at a twelfth stage of the fabrication process.
Figure 13:
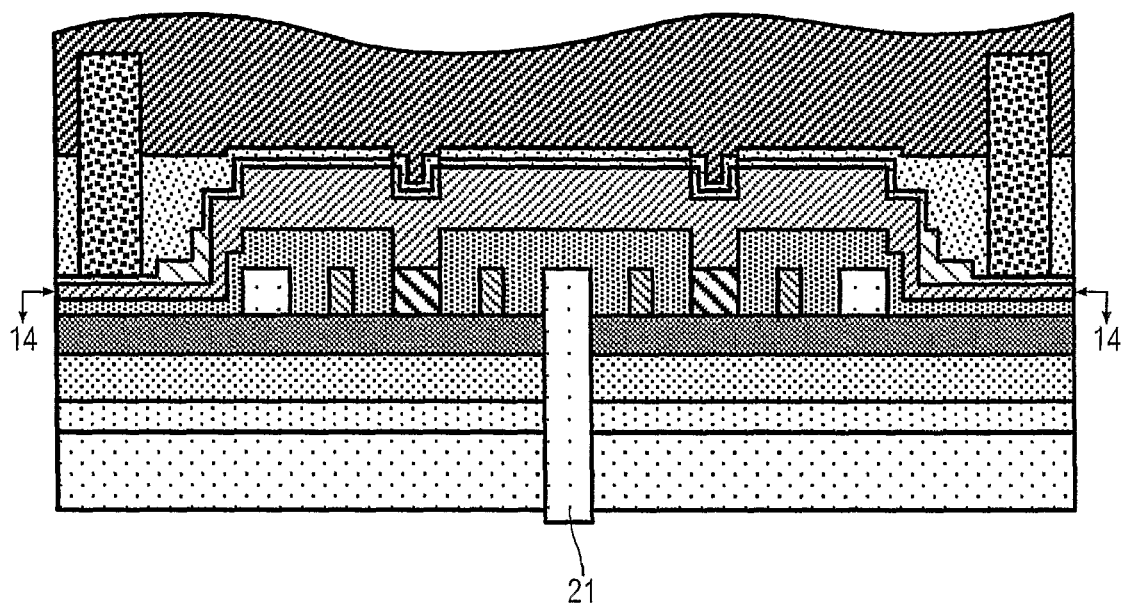
FIG. 13 is a schematic illustration of the device at a thirteenth stage of the fabrication process.
Figure 14:
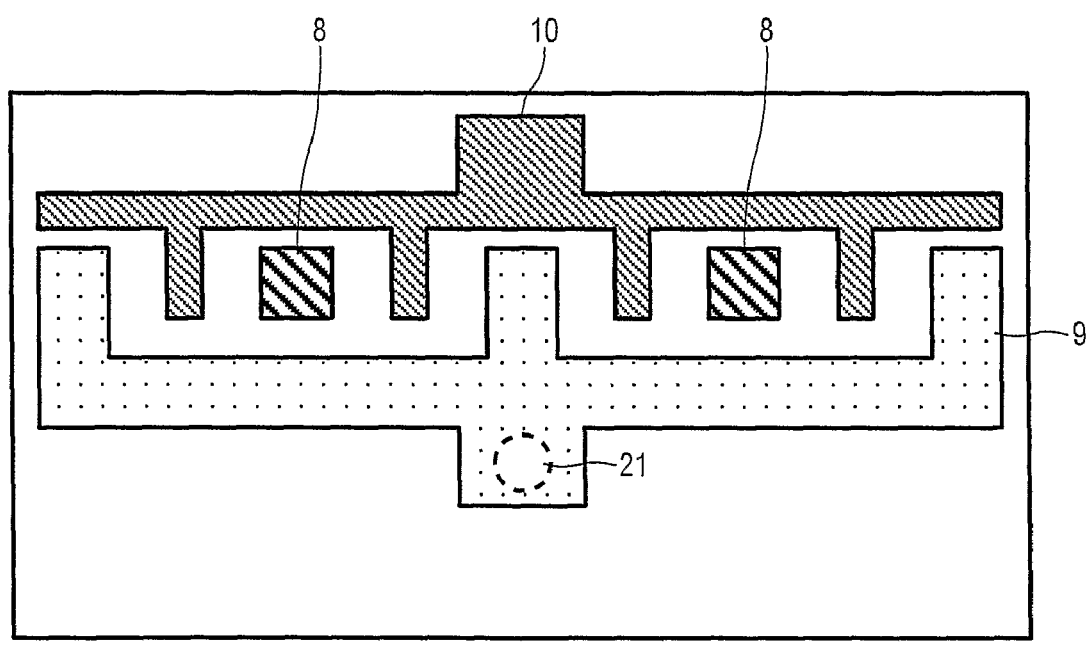
FIG. 14 in a full cross-sectional view along the lines and in the direction of arrows 14-14 on FIG. 13.

A resist layer is applied to the now-exposed surface 19 of the GaN layer 4 and etching takes place to form at least one via 20 through epitaxial layers 13 to the drain contact 9 (FIG. 12). Via 20 is then filled (FIG. 13) to form a drain connection 21. FIG. 14 show a view of the drain connection 20, source contacts 8 and gate contacts 10.

Figure 15:
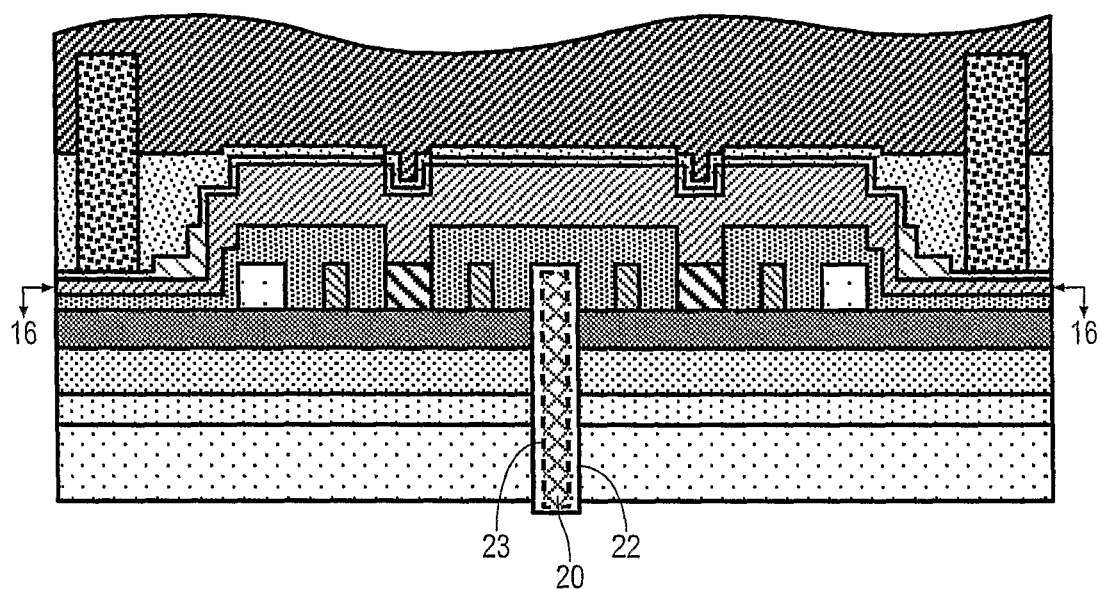
FIG. 15 is a schematic illustration of the device at a fourteenth stage of the fabrication process.

A separate via 22 is formed (FIG. 15) through the expitaxial layers 3 to the gate contact 10 and via 22 is filled to form a gate connection 23.

Figure 16:
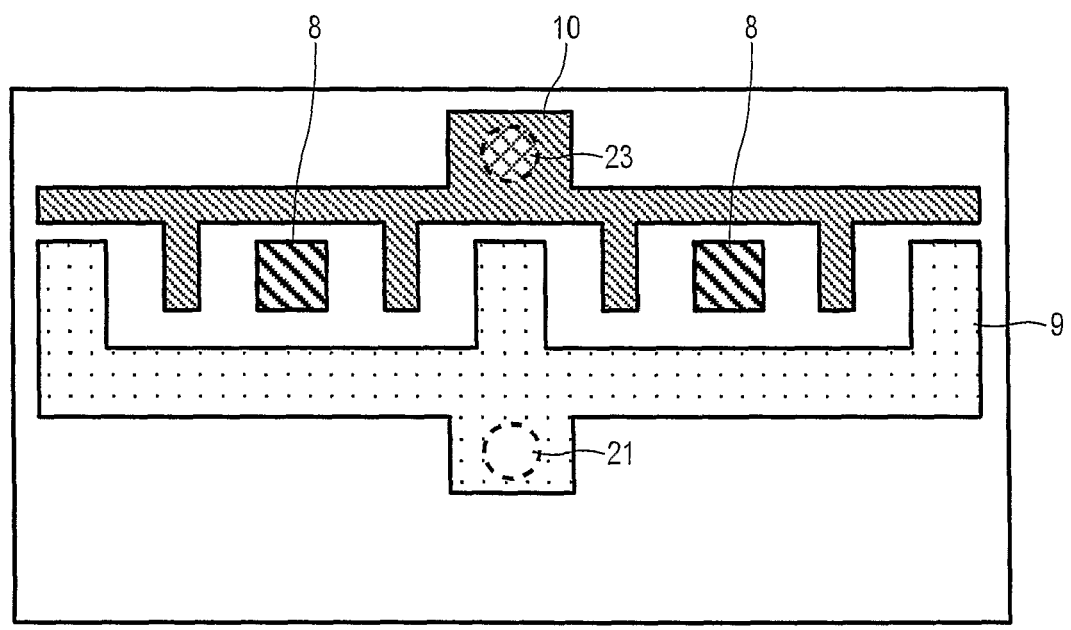
FIG. 16 a full cross-sectional view along the lines and in the direction of arrows 16-16 on FIG. 15.

FIG. 16 shows a view of the gate connection 23 as well as the drains connection 20, and source contact 8.

Figure 17:
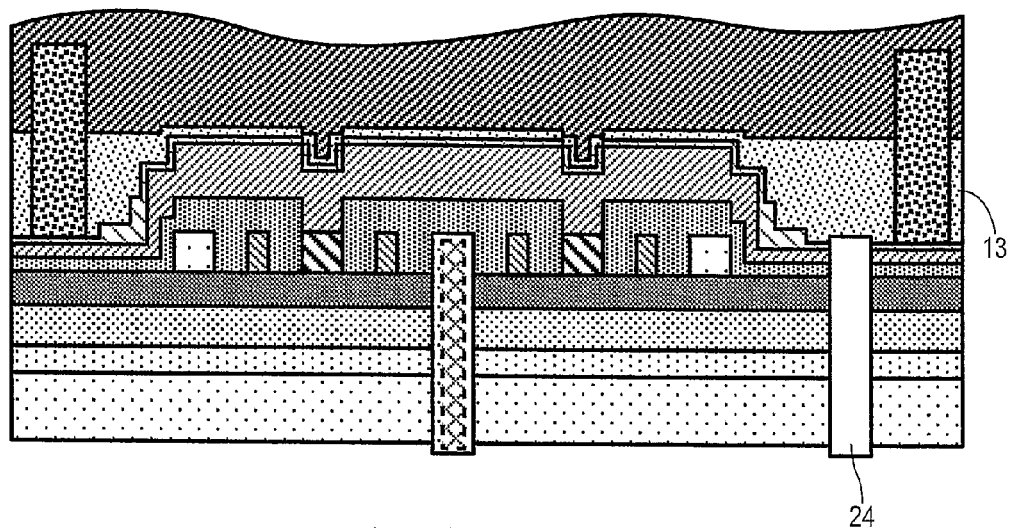
FIG. 17 is a schematic illustration of the device at a fifteenth stage of the fabrication process.
Figure 18:
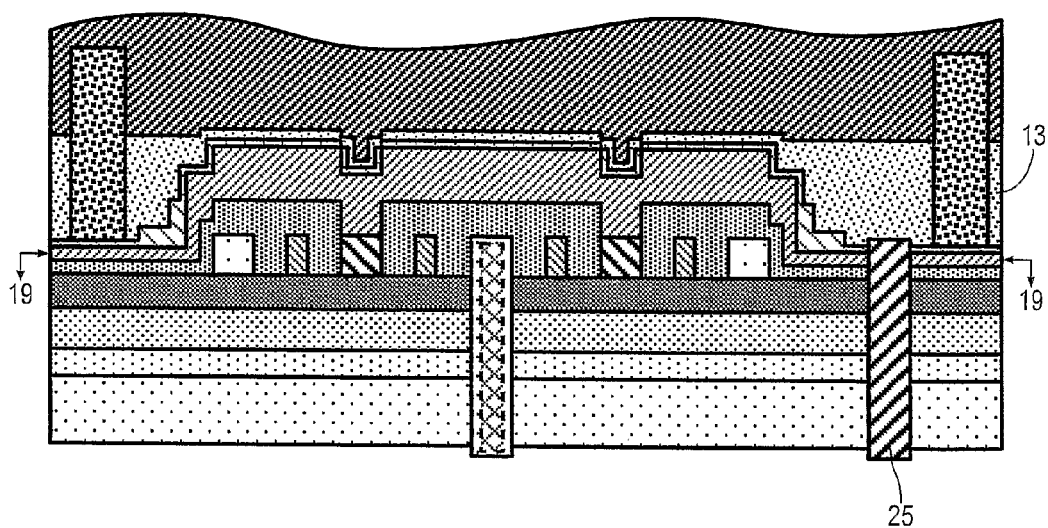
FIG. 18 is a schematic illustration of the device at a sixteenth stage of the fabrication process.

FIGS. 17 and 18 show a similar process for the source connection 8. A via 24 is formed through the expitaxial layers 3 to the source connector layer 13 and the via 24 filled to form the source connection 25.

Figure 19:
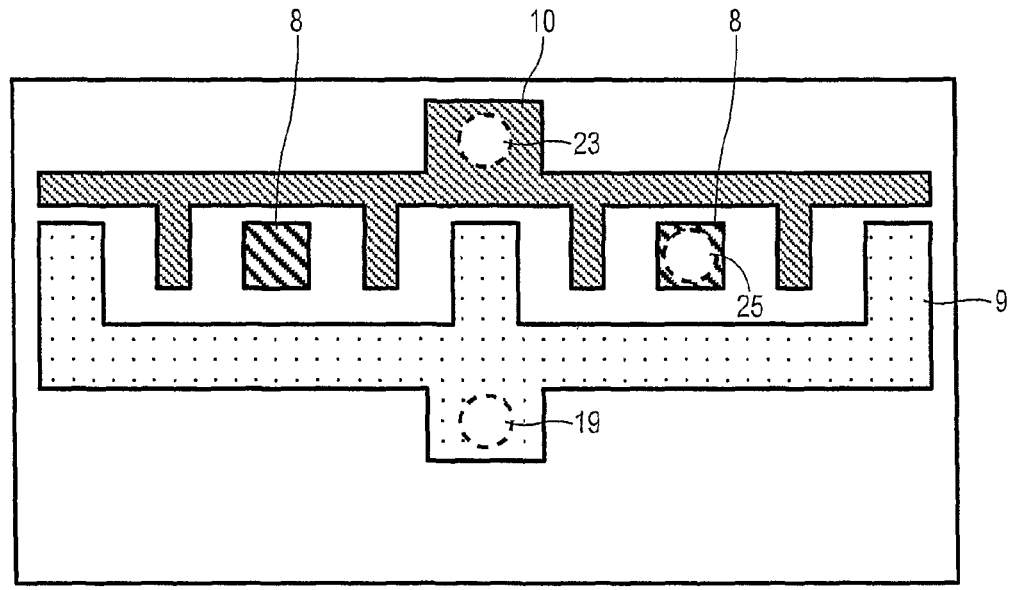
FIG. 19 is a full cross sectional view along the lines and in the direction of arrows 19-19 on FIG. 18.

FIG. 19 shows a view of the source connection 25.

Figure 20:
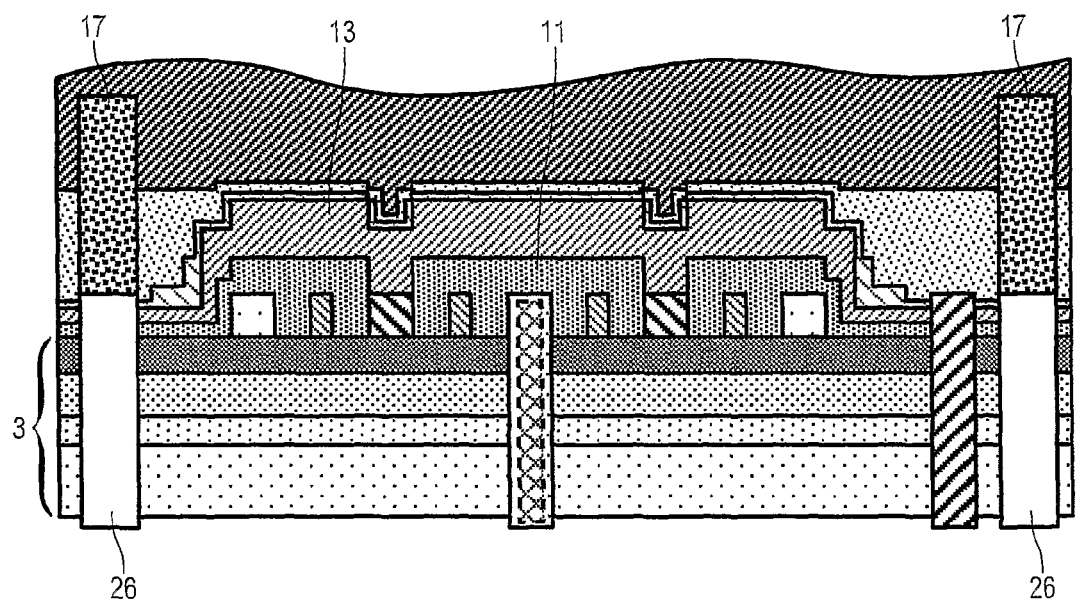
FIG. 20 is a schematic illustration of the device at a seventeenth stage of the fabrication process.

Etching then takes place (FIG. 20) to form gaps 26 through the epitaxial layers 3, passivation layer 11 and conductive layer 13 until the ends of the thick resists 17 are exposed. The thick resists 17 are then removed for die separation.

Figure 22:
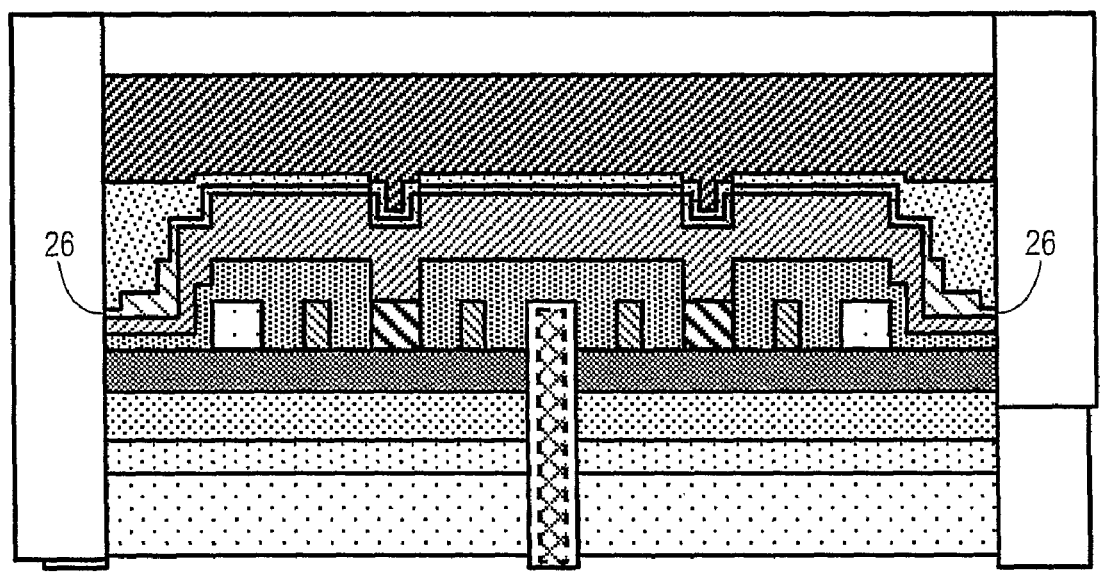
FIG. 22 is a schematic illustration of the device at an alternative final stage of the fabrication process.

This leaves the connections 20, 23 and 25 so the device can be electrically connected. Alternatively, and as shown in FIG. 22, the process of FIGS. 17 and 18 may be avoided with die separation being as described above. Electrical connection for the source contact layer 13 will then be at either or both sides 26.

Figure 21:
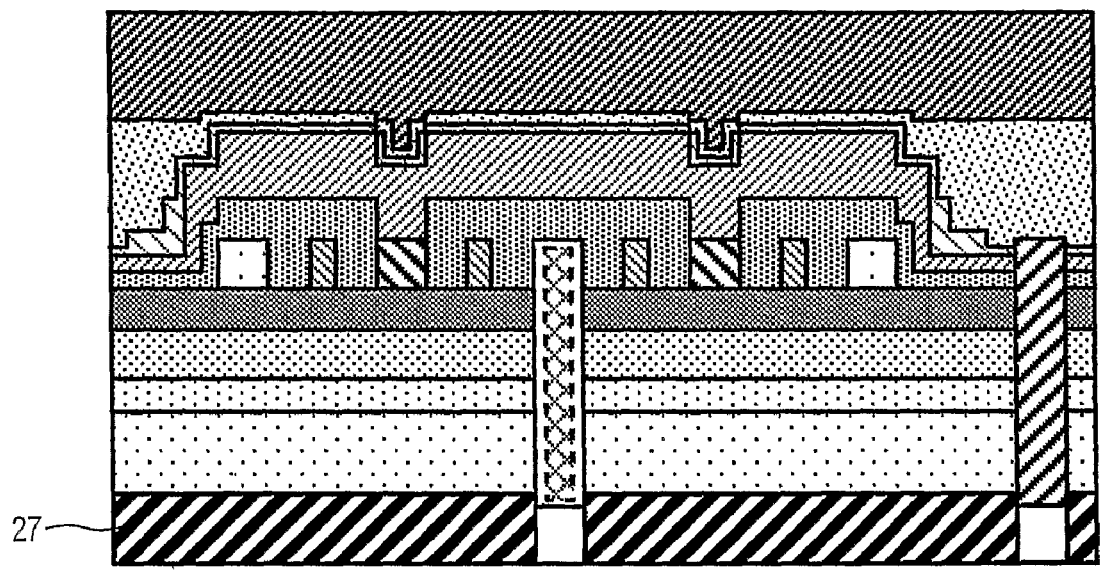
FIG. 21 is a schematic illustration of the device at a final stage of the fabrication process.

If desired, the substrate 1 may be left in place and holes drilled by, for examples, lasers to enable the connections 20, 23 and 25 to be formed. Alternatively, and as shown in FIG. 21, a further layer 27 of a material that is a heat conductive but electronically insulating (e.g. AlN) may be added in place of substrate 1.

In this way the device HEMT device can be used with the relatively thick metal layer 18 acting as one or more of: a contact, heat sink, heat diffuser, and a physical support for the device. The combined effect of the passivation layer 11, the conductive layer 13, the seed layer 14 and the relatively thick layer 18 is that they are all conductive so they all combine to conduct heat away from the epitaxial layers 3, and for them to combine to be a heat sink.

Whilst there has been described in the foregoing description preferred embodiments of the present invention, it will be understood by those skilled in the technology concerned that many variations or modifications in details of design or construction may be made without departing from the present invention.

What is claimed is:

1. A method for fabricating transistors, each transistor comprising a plurality of epitaxial layers on a common substrate, the method comprising:
    forming a plurality of source contacts on a first surface of the plurality of epitaxial layers;
    forming at least one drain contact on the first surface;
    forming at least one gate contact on the first surface;
    forming at least one layer of insulating material over and between the at least one gate contact, the plurality of source contacts and the at least one drain contact for insulating the at least one gate contact, the plurality of source contacts and the at least one drain contact;
    forming a conductive layer over and through at least a part of the at least one insulating layer, the conductive layer connecting the plurality of source contacts;
    forming at least one seed layer on the conductive layer; and
    forming at least one heat sink layer over the at least one seed layer; and
    wherein the at least one seed layer is configured to buffer stresses of thermal expansion caused by the at least one heat sink layer.

2. The method as claimed in claim 1, wherein the transistors are high electron mobility transistors, the plurality of epitaxial layers comprising a layer of gallium nitride, a layer of aluminum gallium nitride, a layer of n+ aluminum gallium nitride and a final layer of gallium nitride, the first surface being on the final layer of gallium nitride, the at least one layer of insulating material being electrically insulating but heat conductive, the conductive layer connecting the plurality of source contacts through vias in the at least one layer of insulating material.

3. The method as claimed in claim 1, wherein the at least one heat sink layer is a relatively thick layer of conductive metal formed over the at least one seed layer, the relatively thick layer of conductive metal being for at least one selected from the group consisting of: a structural support, a heat sink, a heat dissipater, and as a connector.

4. The method as claimed in claim 1, wherein the seed layer comprises a plurality of seed layers, wherein a first of the plurality of seed layers is applied to the conductive layer, the first of the plurality of seed layers being of a material that has a first co-efficient of thermal expansion, and a second seed layer is formed on the first of the plurality of seed layers, the second seed layer being of a material that has a second co-efficient of thermal expansion, the second co-efficient of thermal expansion being greater than the first co-efficient of thermal expansion, one of the first of the plurality of seed layers and the second seed layer being a diffusion barrier for providing a barrier to diffusion of a layer applied to it from diffusing into the epitaxial layers.

5. The method as claimed in claim 1, wherein a source connection is formed by creating then filling at least one via through the common substrate and the plurality of epitaxial layers to the conductive layer.

6. The method as claimed in claim 1, wherein a drain connection is formed by creating then filling at least one via through the common substrate and the plurality of epitaxial layers to the at least one drain contact, a gate connection is formed by creating then filling at least one via through the common substrate and the plurality of epitaxial layers to the at least one gate contact, and a source connection is formed by forming then filling at least one via through the plurality of epitaxial layers to the conductive layer.

7. The method as claimed in claim 1, further comprising removing the common substrate after the at least one heat sink layer is formed, and forming a further layer of electrically insulating and heat conductive material in place of the common substrate.

8. The method as claimed in claim 7, wherein a source connection is formed by forming then filling at least one via through the plurality of epitaxial layers to the conductive layer, a drain connection is formed by creating then filling at least one via through the plurality of epitaxial layers to the at least one drain contact, and a gate connection is formed by creating then filling at least one via through the plurality of epitaxial layers to the at least one gate contact.

9. The method as claimed in claim 1, wherein patterned plating is performed before the at least one heat sink layer is formed.

* * * * *